United States Patent
Hsu et al.

(10) Patent No.: US 9,634,194 B2
(45) Date of Patent: Apr. 25, 2017

(54) LIGHT-EMITTING DIODE CHIP

(71) Applicant: LEXTAR ELECTRONICS CORPORATION, Hsinchu (TW)

(72) Inventors: Nai-Wei Hsu, Tainan (TW); Te-Chung Wang, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/986,559

(22) Filed: Dec. 31, 2015

(65) Prior Publication Data

US 2016/0111602 A1    Apr. 21, 2016

Related U.S. Application Data

(63) Continuation-in-part of application No. 14/325,215, filed on Jul. 7, 2014, now Pat. No. 9,257,609.

(30) Foreign Application Priority Data

Mar. 7, 2014  (TW) .............................. 103107843 A

(51) Int. Cl.
| | | |
|---|---|---|
| H01L 33/00 | (2010.01) | |
| H01L 33/40 | (2010.01) | |
| H01L 33/44 | (2010.01) | |
| H01L 33/38 | (2010.01) | |

(52) U.S. Cl.
CPC ............ *H01L 33/405* (2013.01); *H01L 33/44* (2013.01); *H01L 33/382* (2013.01)

(58) Field of Classification Search
CPC .............................. H01L 33/44; H01L 33/405
USPC ........................................ 257/98, 79, 99, 211
See application file for complete search history.

(56) References Cited

U.S. PATENT DOCUMENTS

| | | |
|---|---|---|
| 2006/0261335 A1 | 11/2006 | Nakahori et al. |
| 2007/0241348 A1 | 10/2007 | Inoue et al. |
| 2010/0127285 A1 | 5/2010 | Jeong |
| 2011/0121346 A1* | 5/2011 | Yamada ............... H01L 51/5234 257/98 |
| 2013/0049564 A1 | 2/2013 | Jung et al. |
| 2013/0146922 A1* | 6/2013 | Kim ......................... A01H 5/02 257/98 |
| 2014/0061704 A1 | 3/2014 | Yamada et al. |

* cited by examiner

*Primary Examiner* — Thien F Tran

(57) ABSTRACT

A light-emitting diode (LED) chip is disclosed. The chip includes a light-emitting diode and an electrode layer on the light-emitting diode. The electrode layer includes a reflective metal layer. The reflective metal layer includes a first composition and a second composition. The first composition includes aluminum or silver, and the second composition includes copper, silicon, tin, platinum, gold, palladium or a combination thereof. The weight percentage of the second composition is greater than 0% and less than 20%.

12 Claims, 9 Drawing Sheets

LIGHT-EMITTING DIODE CHIP

CROSS REFERENCE TO RELATED APPLICATIONS

This application is a continuation-in-part of U.S. application Ser. No. 14/325,215 filed on Jul. 7, 2014 and entitled "LIGHT-EMITTING DIODE CHIP", which claims the priority of Taiwan Patent Application No. 103107843 filed on Mar. 7, 2014, and the entirety of which is incorporated by reference herein.

BACKGROUND OF THE INVENTION

Field of the Invention

The present invention relates to a light-emitting device, and more particularly to a light-emitting diode chip including a reflective metal layer.

Description of the Related Art

Various light-emitting devices have advanced with development and advances in technology to satisfy consumers in the modern world. Among the various light-emitting devices, there has been a trend for light-emitting diodes (LEDs) to gradually replace traditional illuminated devices (for example, fluorescent lamps and incandescent lights) due to advantages such as low heat generation, low power consumption, their long lifespan, and small size.

Generally, an LED chip includes an LED and an electrode layer electrically coupled to the LED. The electrode layer may include a reflective metal layer, which reflects light emitted from the LED to the outside environment, such that the light efficiency of the LED chip can be further improved.

Aluminum or silver is a common material for the reflective metal layer since it is highly reflective of visible light. Aluminum or silver, however, are prone to deterioration due to occurrence of electro-migration under high-current operation, which adversely impacts the light efficiency and the reliability of the LED chip.

Therefore, there is a need for a novel reflective metal layer that is capable of mitigating electro-migration therein while maintaining the reflectivity thereof, thereby improving the overdrive performance of the LED chip.

BRIEF SUMMARY OF THE INVENTION

A detailed description is given in the following embodiments with reference to the accompanying drawings. A light-emitting diode chip is provided.

An exemplary embodiment of light-emitting diode (LED) chip comprises an LED and an electrode layer on the LED. The electrode layer comprises a reflective metal layer. The reflective metal layer comprises a first composition and a second composition, wherein the first composition comprises aluminum (Al) or silver (Ag), and the second composition comprises copper (Cu), silicon (Si), tin (Sn), platinum (Pt), gold (Au), palladium (Pd) or a combination thereof. The weight percentage of the second composition is greater than 0% and less than 20%.

An exemplary embodiment of LED chip comprises an LED and an electrode layer disposed on the LED. The electrode layer comprises a reflective metal layer and an adhesive layer that is between the LED and the reflective metal layer. The reflective metal layer comprises a first composition and a second composition, wherein the first composition comprises Al or Ag and the second composition comprises Cu, Si, Sn, Pt, Au, Pd or a combination thereof. The weight percentage of the second composition is greater than 0% and less than 20%.

An exemplary embodiment of LED chip comprises an LED and a reflective metal layer disposed on the LED. The reflective metal layer comprises a first composition and a second composition, wherein the first composition comprises Al or Ag and the second composition comprises Cu, Si, Sn, Pt, Au, Pd or a combination thereof. The weight percentage of the second composition is greater than 0% and less than 20%.

According to the embodiments of the invention, the grain size of the reflective metal layer can be reduced by adding a few second compositions therein, thereby increasing the reflectivity of the reflective metal layer and improving the light efficiency of the LED chip. Besides, it can be observed from the results of the high current aging test that electro-migration in the reflective metal layer occurs less, thus the overdrive performance of the LED chip can be improved. Furthermore, it is noted that the variation of the operating voltage of the LED chip with time is decreased, according to the embodiments of the invention. Namely, the reliability of the LED chip can be maintained during long-term operation, according to the embodiments of the invention.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of implementing the invention. This description is made for the purpose of illustrating the general principles of the invention and should not be taken in a limiting sense. The scope of the invention is best determined by reference to the appended claims.

Figure 1:
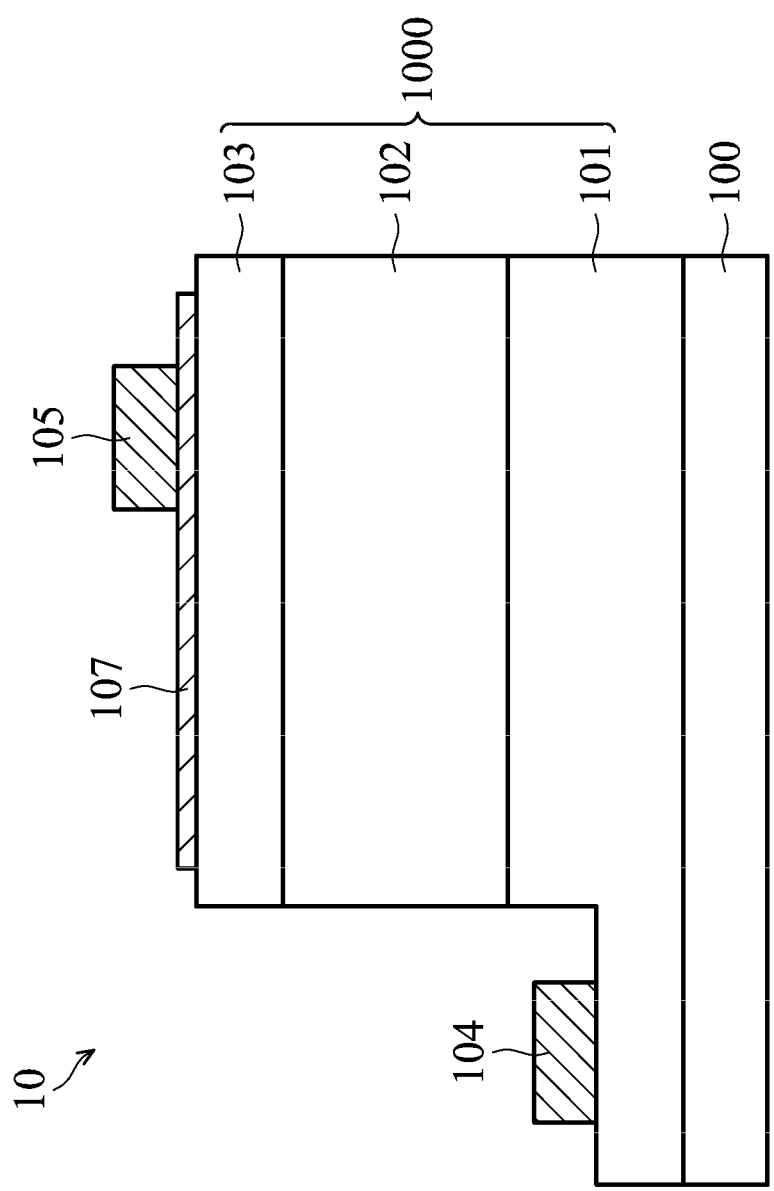
FIG. 1 is a cross-sectional view of an LED chip according to an embodiment of the invention.

Please refer to FIG. 1, which illustrates a cross-sectional view of an LED chip 10 according to an embodiment of the invention. The LED chip 10 includes a substrate 100, an LED 1000 composed of a first conductivity-type semiconductor layer 101, an active layer 102 and a second conductivity-type semiconductor layer 103, an ohmic contact layer 107 and electrode layers 104 and 105 electrically coupled to the first conductivity-type semiconductor layer 101 and the ohmic contact layer 107, respectively. In the embodiment, the LED chip 10 is a horizontal-type structure, in which the electrode layers 104 and 105 are provided on the same side of the LED chip 10.

In the embodiment, the substrate 100 comprises sapphire, SiC, Si or any known LED substrates, which may act as a growth substrate for forming the LED 1000.

In the embodiment, the first conductivity-type semiconductor layer 101 and the second conductivity-type semiconductor layer 103 comprise a III-V type semiconductor, such as GaN, AlGaN, InGaN, AlInGaN, GaP, GaAsP, GaInP, AlGaInP, AlGaAs or a combination thereof. The first conductivity-type semiconductor layer 101 and the second conductivity-type semiconductor layer 103 may be formed by any suitable methods, such as chemical vapor deposition (CVD), metal organic chemical vapor deposition (MOCVD), plasma enhanced chemical vapor deposition (PECVD), molecular beam epitaxy, hydride vapor phase epitaxy or sputtering. In an embodiment, the first conductivity-type semiconductor layer 101 is a N-type semiconductor layer and the second conductivity-type semiconductor layer 103 is a P-type semiconductor layer. In another embodiment, the first conductivity-type semiconductor layer 101 is a P-type semiconductor layer and the second conductivity-type semiconductor layer 103 is a N-type semiconductor layer.

In the embodiment, the active layer 102 comprises a multiple quantum well (MQW) structure composed of a stack of barrier layers and quantum well layers (not shown) in an alternating arrangement. For example, the active layer 102 may comprise a stack of alternating GaN/InGaN, in which GaN acts as a material for the barrier layer and InGaN act as a material for the quantum well layer, but it is not limited thereto. The active layer 102 may be formed by methods similar to those for forming the first conductivity-type semiconductor layer 101 and the second conductivity-type semiconductor layer 103, and are not described again in detail herein.

In the embodiment, the ohmic contact layer 107 may comprise indium tin oxide (ITO) or any suitable conducting materials, which may be formed by sputtering, evaporation or any suitable methods. The ohmic contact layer 107 is capable of reducing the energy barrier between the electrode layer 105 and the second conductivity-type semiconductor layer 103, such that the electrode layer 105 is in ohmic contact with the second conductivity-type semiconductor layer 103.

Figure 2:
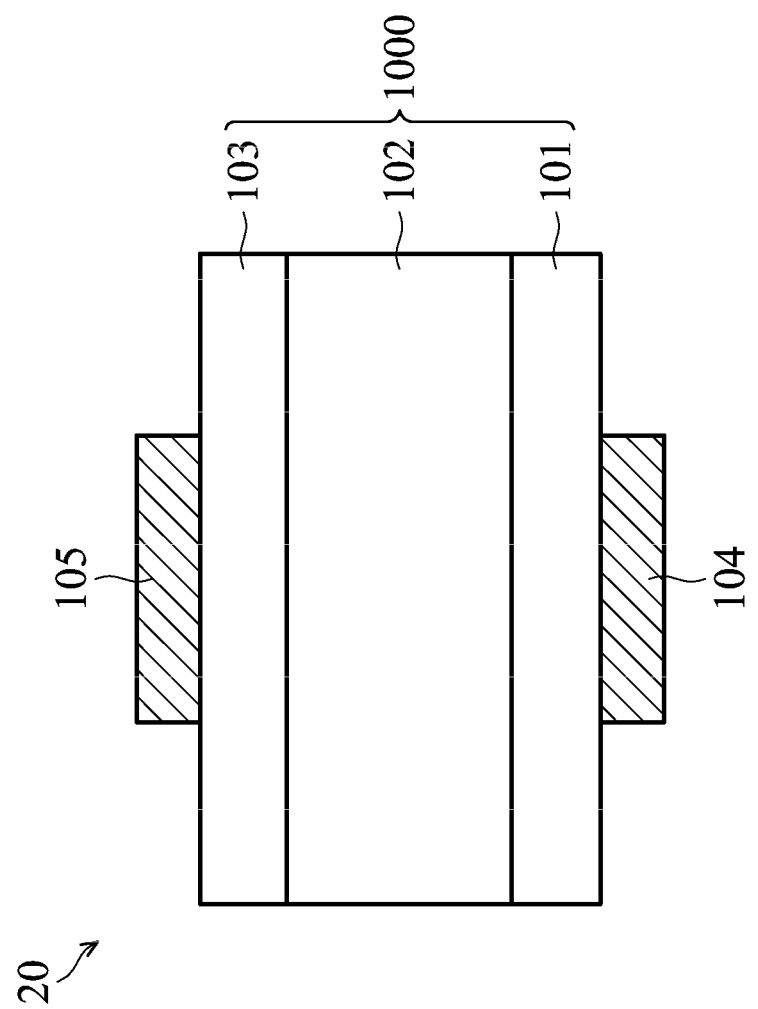
FIG. 2 is a cross-sectional view of an LED chip according to another embodiment of the invention.

Please refer to FIG. 2, which illustrates a cross sectional view of an LED chip 20 according to another embodiment of the invention, wherein elements in FIG. 2 that are the same as those in FIG. 1 bear the same reference numbers. The LED chip 20 comprises an LED 1000 composed of a first conductivity-type semiconductor layer 101, an active layer 102 and a second conductivity-type semiconductor layer 103, and electrode layers 104 and 105 electrically coupled to the first conductivity-type semiconductor layer 101 and the second conductivity-type semiconductor layer 103, respectively. In the embodiment, the LED chip 20 is a vertical-type structure. The difference between the embodiment of FIG. 2 and that of FIG. 1 lies in that the electrode layers 104 and 105 of FIG. 2 being respectively disposed on the upper and lower sides of the LED chip 20 rather than on the same side.

Figure 3:
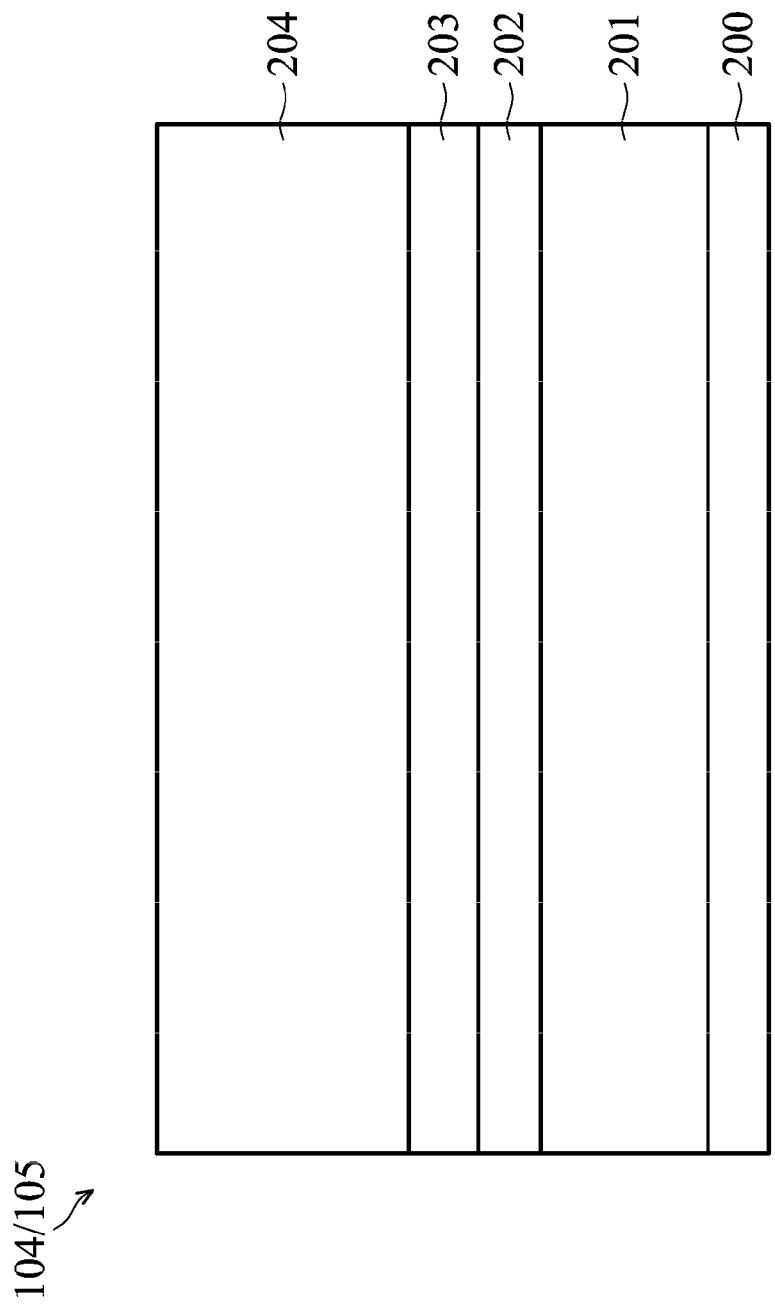
FIG. 3 is a cross-sectional view of an electrode layer according to some embodiments of the invention.

Please referring to FIG. 3, which illustrates a cross sectional view of an electrode layer 104 according to some embodiments of the invention. It is appreciated that the electrode layer structure described below may apply to the electrode layer 105 or electrode layers for other types of the LED chips. In the embodiment, the electrode layer 104 comprises a first adhesive layer 200, a reflective metal layer 201, a second adhesive layer 202, a diffusion barrier layer 203 and a bonding layer 204 stacked sequentially.

In the embodiment, the first adhesive layer 200 comprises Cr, Ti, Pd, Pt, Ni, Au, Ag or a combination thereof, which may reduce the energy barrier between the electrode layer 104 and the first conductivity-type semiconductor layer 101, such that the electrode layer 104 is in ohmic contact with the first conductivity-type semiconductor layer 101.

In the embodiment, the reflective metal layer 201 comprises a first composition. The first composition comprises the metal with high reflectivity with respect to the light having a specific wavelength (e.g., visible light), such that the light emitted to the electrode layer 104 can be reflected toward the outside environment and therefore the light efficiency of the LED chip can be improved. In an embodiment, the first composition comprises Al or Ag.

In the embodiment, the reflective metal layer 201 further comprises a second composition comprising Cu, Si, Sn, Pt, Au, Pd or a combination thereof. According to the experimental results described below, the electro-migration in the reflective metal layer 201 is mitigated by adding the second composition therein. Furthermore, as compared with the reflective metal layer 201 without adding the second composition (e.g., pure aluminum or pure silver), the reflective metal layer 201 with the second composition added has a relatively smaller grain size, such that the reflectivity thereof can be increased.

In an embodiment, the percentage of the second composition in the reflective metal layer 201 is less than 20% to prevent the reflectivity of the reflective metal layer 201 from decreasing due to the proportion of the first composition in the reflective metal layer 201 becoming too low.

In an embodiment, the first composition of the reflective metal layer 201 comprises Al, and the second composition of the reflective metal layer 201 comprises Cu. In this embodiment, the reflective metal layer 201 may comprise an Al—Cu or Al—Si—Cu alloy. In another embodiment, the first composition of the reflective metal layer 201 comprises Ag, and the second composition of the reflective metal layer 201 comprises Cu. In this embodiment, the reflective metal layer 201 may comprise an Ag—Cu or Ag—Si—Cu alloy. In the subsequent description, the Al—Cu alloy is selected as an example to describe the embodiment of the disclosure. It is appreciated, however, that the present invention is not limited thereto.

Figure 4:
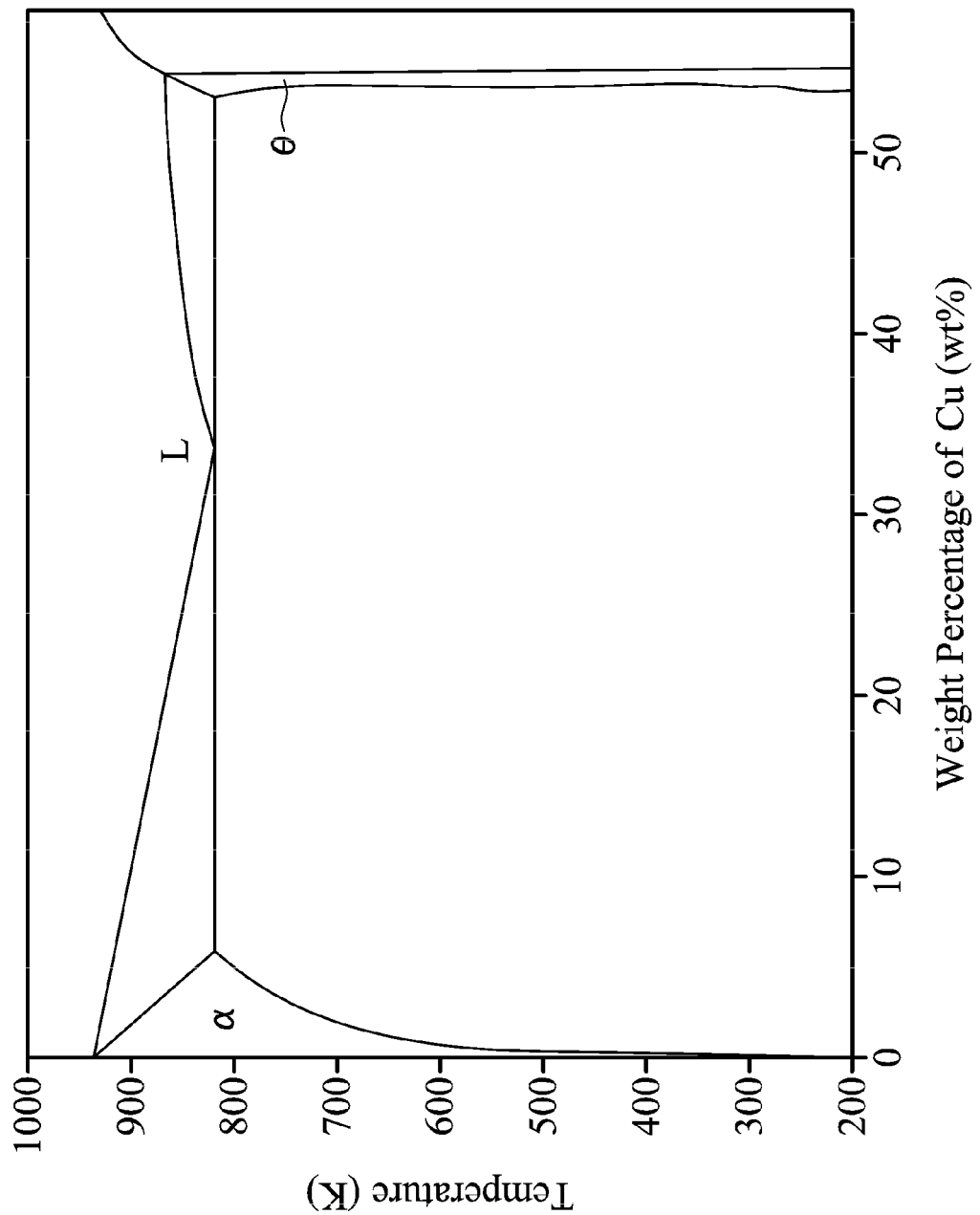
FIG. 4 is an Al—Cu alloy phase diagram.

In an embodiment, the weight percentage (wt %) of Cu of the second composition is in a range of about 0.1%-2%. For example, the weight percentage of Cu of the second composition may be 1.5%. With respect to the Al—Cu phase diagram shown in FIG. 4, in the case where the reflective metal layer 201 is an Al—Cu alloy, the above-mentioned range of the weight percentage of Cu allows Cu to be stabilized in the α-phase alloy, in which Al is the major composition, under a temperature lower than 700° C.

Figure 5:
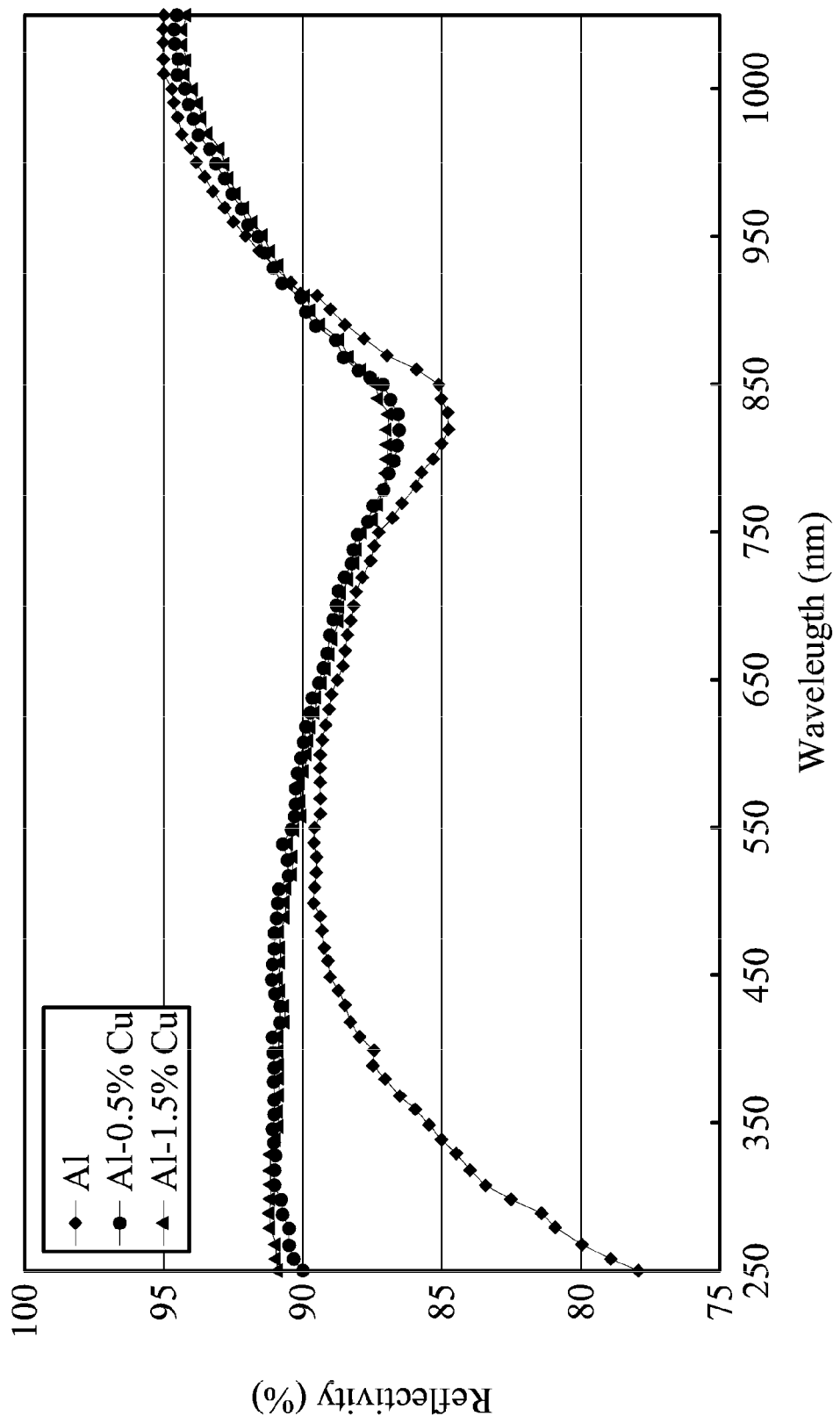
FIG. 5 is a graph illustrating a comparison of the reflectivity of the reflective metal layer at various wavelengths with respect to different Cu content in the reflective metal layer, according to some embodiments of the invention.

Referring to FIG. 5, which illustrates a comparison of the reflectivity of the reflective metal layer 201 at various wavelengths with respect to different Cu content in the reflective metal layer 201, according to some embodiments of the invention. As shown in FIG. 5, the Al—Cu alloy with 0.5% or 1.5% Cu content has a higher reflectivity to visible light compared to pure aluminum without adding Cu therein. For example, for the wavelength of light ranged between 440 nm-460 nm, the reflectivity of the pure aluminum is 88%, while the reflectivity of the Al—Cu alloy with 0.5% or 1.5% Cu content can be increased to 91%.

In the embodiments mentioned above, the increase of the reflectivity of the reflective metal layer 201 results from the reduction of the grain size. For pure aluminum, the root mean square (RMS) grain size is about 12 nm. However, when 0.5% or 1.5% Cu is added into aluminum, the RMS grain size can be reduced to 0.8 nm. Therefore, the reflectivity of the reflective metal layer 201 can be increased.

Figure 6:
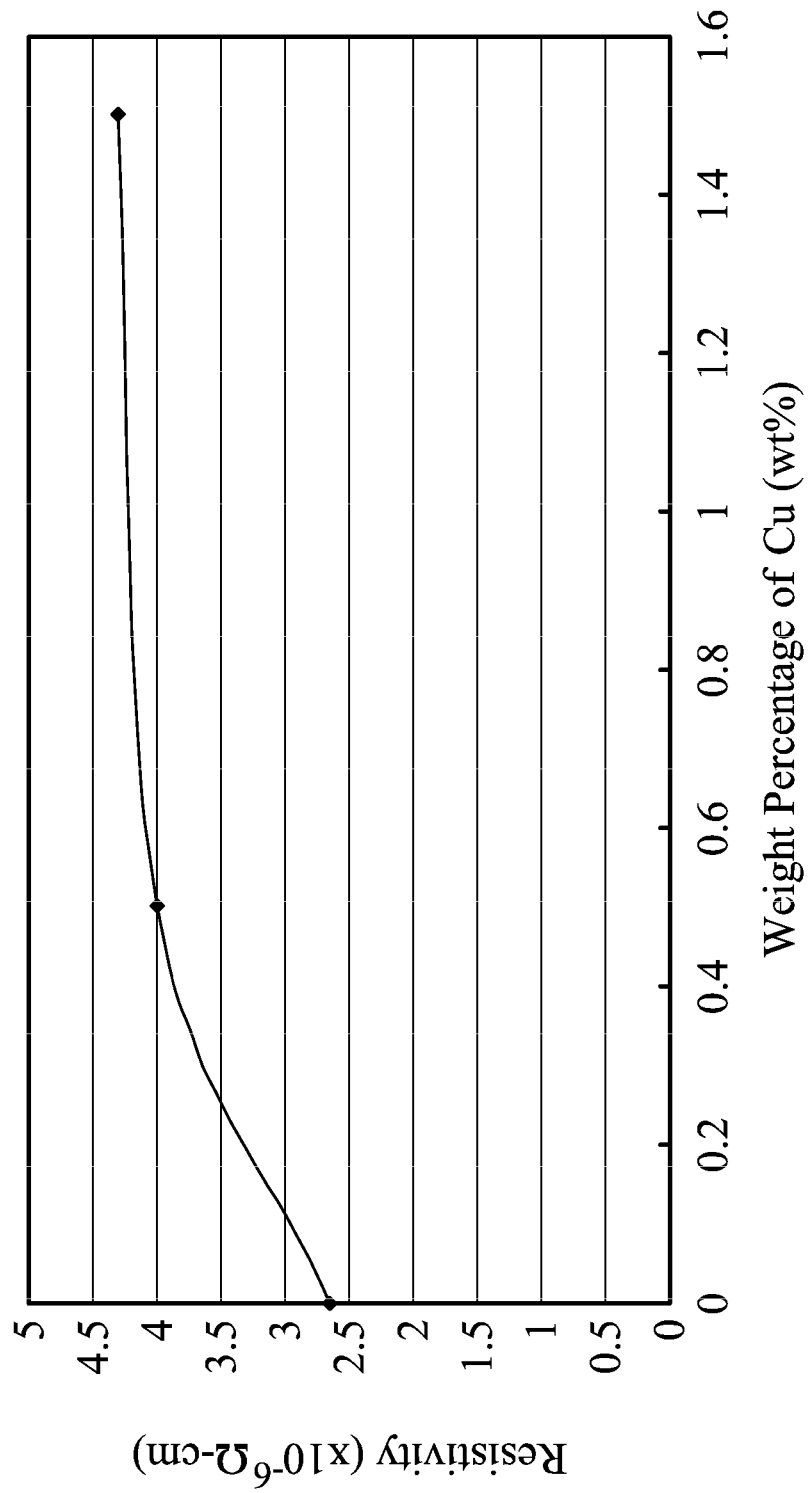
FIG. 6 is a graph illustrating a comparison of the resistivity of the reflective metal layer with respect to different Cu content in the reflective metal layer, according to some embodiments of the invention.

Referring to FIG. 6, which illustrates a comparison of the resistivity of the reflective metal layer 201 with respect to different Cu content in the reflective metal layer 201, according to some embodiments of the invention. As shown in FIG. 6, there is only a slight increase in the resistivity of the Al—Cu alloy with 0.5% or 1.5% Cu content compared to pure aluminum without adding Cu therein (i.e., 0% Cu). Such a slight increase will not adversely affect the operation of the LED chip.

Figure 7:
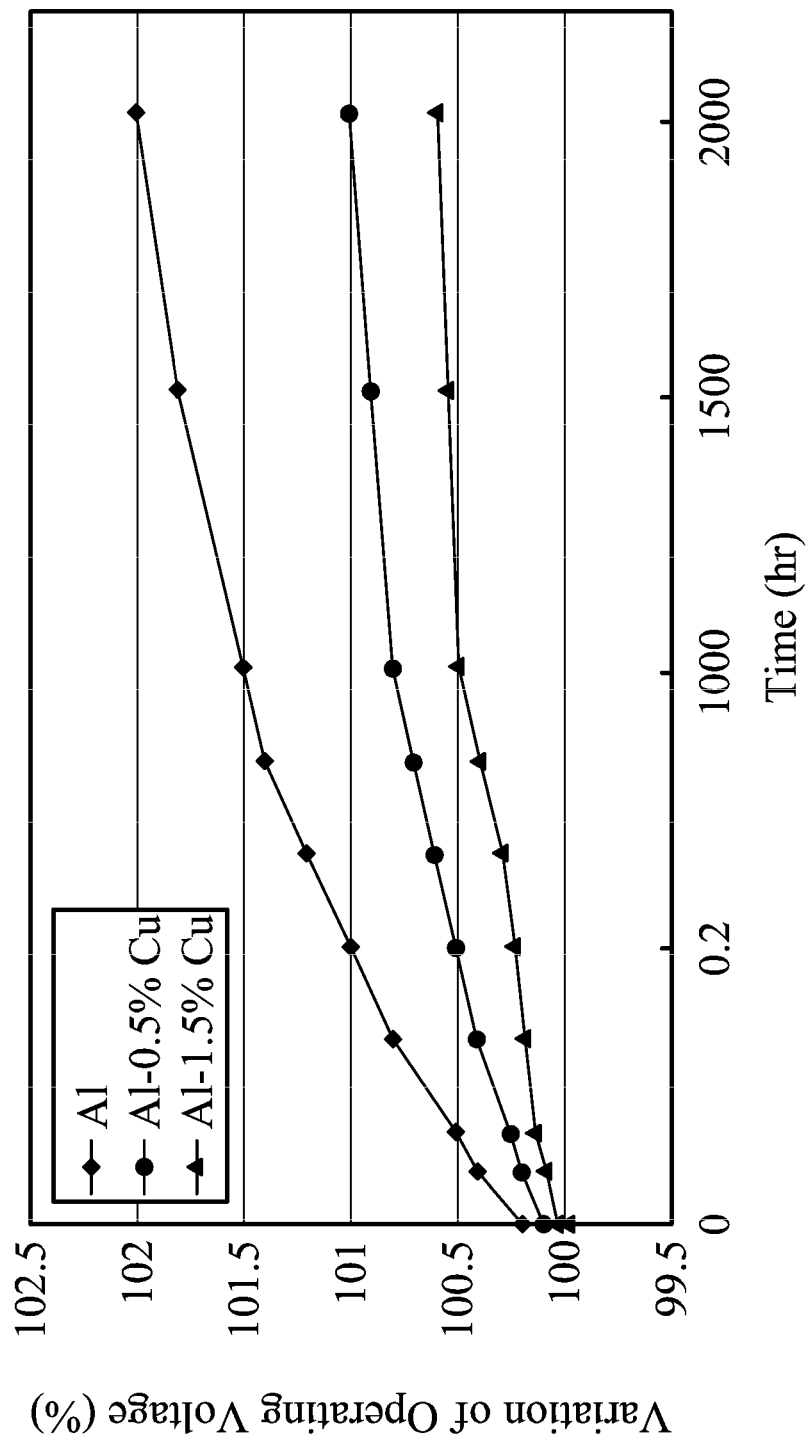
FIG. 7 is a graph illustrating a comparison of the variation of the operating voltage of the LED chip with time with respect to different Cu content in the reflective metal layer, according to some embodiments of the invention.

Referring to FIG. 7, which illustrates a comparison of the variation of the operating voltage of the LED chip with time with respect to different Cu content in the reflective metal layer, according to the results of high current aging test. As shown in FIG. 7, as compared to the embodiment of the pure aluminum, the variation of the operating voltage of the LED chip with time becomes lower when Cu is added into the reflective metal layers 201. Moreover, as Cu content in the reflective metal layer 201 is increased, the variation of the operating voltage of the LED chip with time is suppressed as well.

As observed by the electron microscopy in the high current aging test, the crystal structure of the reflective metal layer 201 with Cu added therein is less damaged compared to that of the reflective metal layer 201 without adding Cu therein (e.g., pure aluminum). Namely, the reflective metal layer 201 with Cu added has better electro-migration resistance.

Please refer to FIG. 3. In the embodiment, the diffusion barrier layer 203 comprises Pt, Ti, W, Ni, Pd or a combination thereof, which can prevent compositions in the bonding layer 204 from diffusing to underlying layers (e.g., reflective metal layer 201). In an embodiment, the second adhesive layer 202 comprising Cr, Ti, Ni or any suitable adhesive material may be disposed between the diffusion barrier layer 203 and the reflective metal layer 201, such that the diffusion barrier layer 203 is readily bonded to the reflective metal layer 201.

In the embodiment, the bonding layer 204 comprises Au, Sn, Zn, In, Ag or a combination thereof, which is used for bonding and electrically connecting the LED to the external components (e.g., wire, conductive bump or solder).

Figure 8:
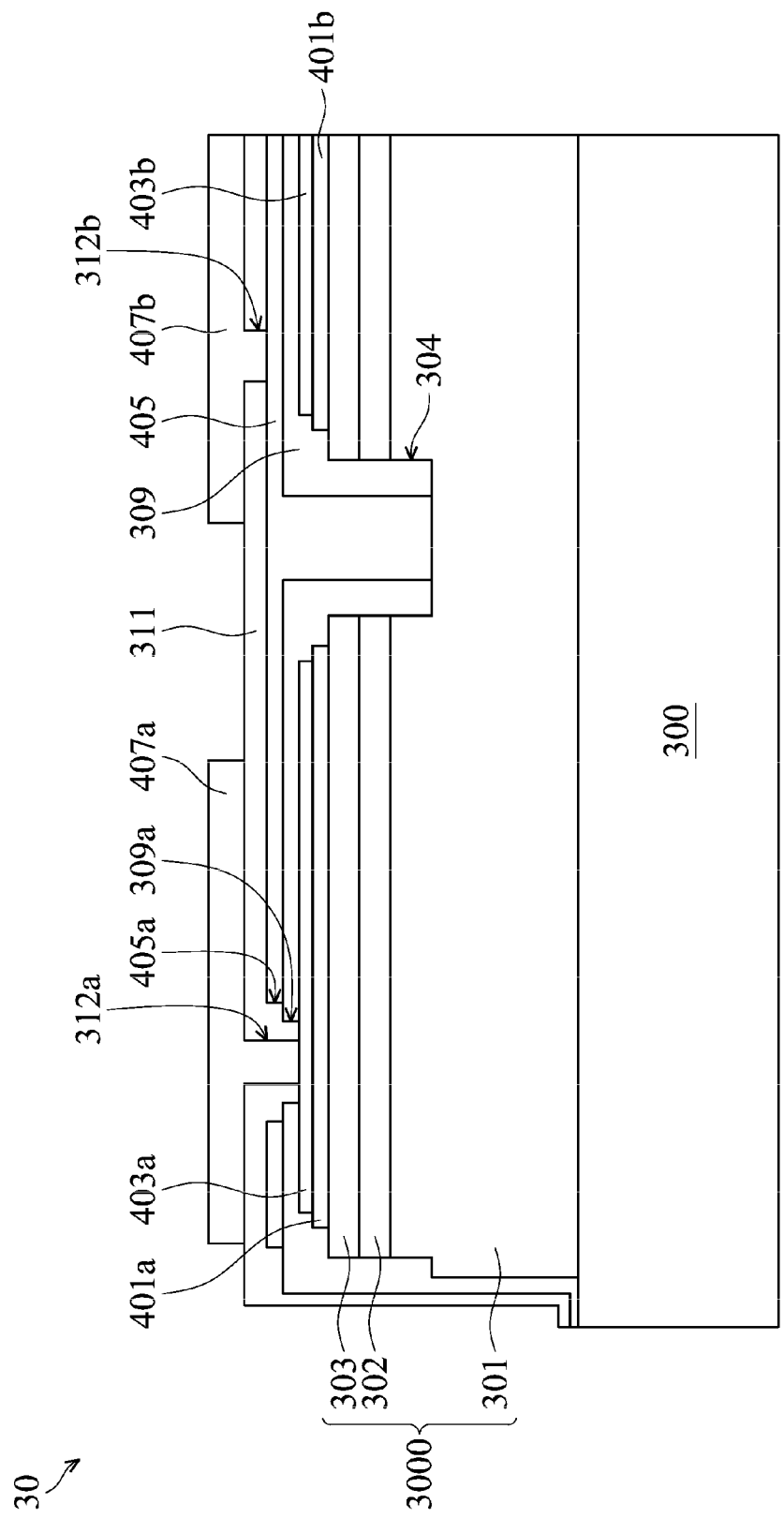
FIG. 8 is a cross-sectional view of a flip-chip LED chip according to an embodiment of the invention.

Please refer to FIG. 8, which illustrates a cross-sectional view of a flip-chip LED chip 30 according to an embodiment of the invention. In the embodiment, the flip-chip LED chip 30 is also a horizontal-type structure, in which the electrode layers are provided on the same side of the flip-chip LED chip 30.

The flip-chip LED chip 30 comprises an LED 3000 composed of a first conductivity-type semiconductor layer 301, an active layer 302 and a second conductivity-type semiconductor layer 303 disposed on a substrate 300. The substrate 300 may comprise a material that is the same as or similar to the material of the substrate 100 shown in FIG. 1.

In the embodiment, the first conductivity-type semiconductor layer 301 and the second conductivity-type semiconductor layer 303 of the flip-chip LED 3000 may comprise materials that are the same as or similar to the materials of the first conductivity-type semiconductor layer 101 and the second conductivity-type semiconductor layer 103 of the LED 1000, respectively, shown in FIG. 1. Also, the first conductivity-type semiconductor layer 301 and the second conductivity-type semiconductor layer 303 of the flip-chip LED 3000 may be formed by any suitable method, such as CVD, MOCVD, PECVD, molecular beam epitaxy, hydride vapor phase epitaxy, or sputtering. In an embodiment, the first conductivity-type semiconductor layer 301 is an N-type semiconductor layer and the second conductivity-type semiconductor layer 303 is a P-type semiconductor layer. In another embodiment, the first conductivity-type semiconductor layer 301 is a P-type semiconductor layer and the second conductivity-type semiconductor layer 303 is an N-type semiconductor layer.

In the embodiment, the active layer 302 of the flip-chip LED 3000 may comprise a structure that is the same as or similar to that of the active layer 102 of the LED 1000 shown in FIG. 1, but it is not limited thereto. Moreover, the active layer 302 may be formed by methods that are similar to those used for forming the first conductivity-type semiconductor layer 301 and the second conductivity-type semiconductor layer 303.

In the embodiment, the flip-chip LED chip 30 further comprises a reflective metal layer (including reflective metal layers 401a and 401b) that is disposed on the second conductivity-type semiconductor layer 303 of the LED 3000. The reflective layers 401a and 401b are separated from each other by a recess 304 that extends from a top surface of the second conductivity-type semiconductor layer 303 into a portion of the first conductivity-type semiconductor layer 301. As a result, a portion of first conductivity-type semiconductor layer 301 is exposed from the recess 304. In an embodiment, the reflective metal layers 401a and 401b may comprise a single layer or a multi-layer structure. In some embodiments, the reflective metal layers 401a and 401b may be formed onto the second conductivity-type semiconductor layer 303 of the LED 3000 by adhesive layers (not shown) or ohmic contact layers (not shown). In the embodiment, the materials of the reflective metal layers 401a and 401b may be the same as or similar to the material of the reflective metal layer 201 shown in FIG. 3. Moreover, the materials of the adhesive layers may be the same as or similar to the material of the first adhesive layer 200 shown in FIG. 3 and the materials of the ohmic contact layers may be the same as or similar to the material of the ohmic contact layer 107 shown in FIG. 1.

In the embodiment, the flip-chip LED chip 30 further comprises a diffusion barrier layer (including diffusion barrier layers 403a and 403b) that is disposed on the reflective metal layers 401a and 401b. For example, the diffusion barrier layer 403a is disposed on the reflective metal layer 401a and the diffusion barrier layer 403b is disposed on the reflective metal layer 401b. In an embodiment, the diffusion barrier layers 403a and 403b may comprise a single layer or a multi-layer structure. In some embodiments, the diffusion barrier layers 403a and 403b may comprise the first and second compositions of the reflective metal layer 201 shown in FIG. 3. In this case, the weight percentage of the second composition in the diffusion barrier layers 403a and 403b is greater than 0% and less than 20%. In an embodiment, the weight percentage (wt %) of Cu of the second composition is in a range of about 0.1%-2%. For example, the weight percentage of Cu of the second composition may be 1.5%.

In the embodiment, the flip-chip LED chip 30 further comprises a first isolation layer 309 that is disposed on the diffusion barrier layers 403a and 403b and is further extended to cover the reflective metal layers 401a and 401b, the sidewalls of the recess 304 and the LED 3000. Moreover, the first isolation layer 309 has an opening 309a to expose a portion of the diffusion barrier layers 403a. The first isolation layer 309 may comprise a dielectric material or any suitable material used for a passivation layer. In some embodiments, a protective layer (not shown) may be disposed on the sidewall of the recess 304 and covered by the first isolation layer 309 in the recess 304.

In the embodiment, the flip-chip LED chip 30 further comprises a conductive metal layer 405 that is disposed on the first isolation layer 309 above the diffusion barrier layers 403a and 403b. Moreover, a portion of the conductive metal layer 405 further extends to fill in the recess 304 and be separated from the sidewalls of the recess 304 by the first isolation layer 309, so as to be in contact with the first conductivity-type semiconductor layer 301. Moreover, the conductive metal layer 405 has an opening 405a above the opening 309a to expose a portion of the first isolation layer 309 and the portion of the diffusion barrier layer 403a that is exposed from the opening 309a. In an embodiment, the conductive metal layer 405 may comprise a single layer or a multi-layer structure. In some embodiments, the conductive metal layer 405 may comprise the first and second compositions of the reflective metal layer 201 shown in FIG. 3. In this case, the weight percentage of the second composition in the conductive metal layer 405 is greater than 0% and less than 20%. In an embodiment, the weight percentage (wt %) of Cu of the second composition is in a range of about 0.1%-2%. For example, the weight percentage of Cu of the second composition may be 1.5%.

In the embodiment, the flip-chip LED chip 30 further comprises a second isolation layer 311 that is disposed on the conductive metal layer 405 and is further extended in the openings 309a and 405a to cover the sidewalls thereof. Moreover, the second isolation layer 311 has openings 312a and 312b corresponding to the diffusion barrier layers 403a and 403b, respectively. The opening 312a exposes a portion of the diffusion barrier layers 403a that is exposed from the opening 309a. The opening 312b exposes a portion of the conductive metal layer 405 above the diffusion barrier layer 403b. The second isolation layer 311 may comprise a dielectric material or any suitable materials used for a passivation layer. Moreover, the second isolation layer 311 may comprise a material that is the same as or similar to the material of the first isolation layer 309.

In the embodiment, the flip-chip LED chip 30 further comprises bonding layers 407a and 407b that are individually disposed on the second isolation layer 311 above the diffusion barrier layers 403a and 403b. Namely, the bonding layer 407a is disposed directly above the diffusion barrier layer 403a and the bonding layer 407b is disposed directly above the diffusion barrier layer 403b. The bonding layers 407a and 407b serve as bond pads or portions of electrodes for the flip-chip LED chip 30.

A portion of the bonding layer 407a passes through the second isolation layer 311 via the openings 312a, so as to be in contact with the exposed portion of the diffusion barrier layer 403a. A portion of the bonding layer 407b extends through the second isolation layer 311 via the opening 312b, so as to be in contact with the exposed portion of the conductive metal layer 405.

In an embodiment, the bonding layers 407a and 407b may comprise a single layer or a multi-layer structure. In some embodiments, at least one of the bonding layers 407a and 407b may comprises the first and second compositions of the reflective metal layer 201 shown in FIG. 3. In this case, the weight percentage of the second composition in one of the bonding layers 407a and 407b is greater than 0% and less than 20%.

In the embodiment, the reflective metal layer 401a, the diffusion barrier layer 403a, and the bonding layer 407a constitute a first electrical connecting path that is electrically coupled to the second conductivity-type semiconductor layer 303 of the LED 3000. Moreover, the conductive metal layer 405 and the bonding layer 407b constitute a second electrical connecting path that is electrically coupled to the first conductivity-type semiconductor layer 301 of the LED 3000.

In the embodiment, the first and second electrical connecting paths comprise the first composition, such as Al or Ag, with high reflectivity with respect to the light having a specific wavelength (e.g., visible light). As a result, the light emitted to the first and second electrical connecting path can be reflected toward the outside environment and therefore the light efficiency of the flip-chip LED chip 30 can be improved.

Moreover, the first and second electrical connecting paths further comprises a second composition, such as Cu, Si, Sn, Pt, Au, Pd or a combination thereof. It should be understood that the impact of the electro-migration is increased under high-current operation. When vacancies are formed in the Al-containing current path by the migration of Al atoms due to the electro-migration effect, these vacancies can be filled by Cu atoms. Accordingly, the electro-migration effect in the electrical connecting path can be effectively mitigated by the second composition therein. As a result, the reliability of the electrical connecting path can be improved even under high-current operation.

Additionally, the aluminum-containing electrical connecting path can corrode easily by the halogen elements from environment. Also, the second composition, such as Cu, in the first and second electrical connecting paths can enhance the resistance to the impurity. Accordingly, the stability of the first and second electrical connecting paths is also increased.

Figure 9:
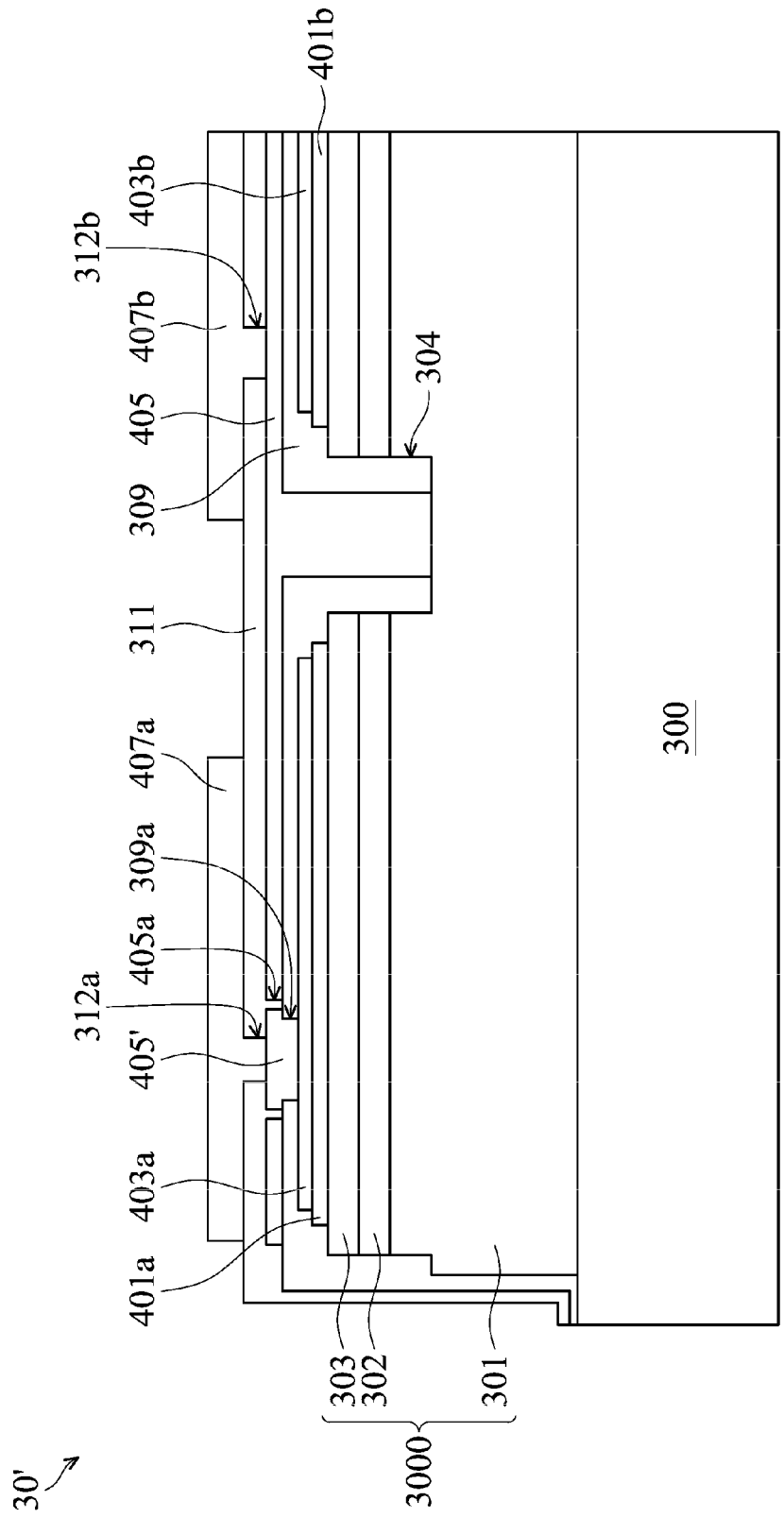
FIG. 9 is a cross-sectional view of a flip-chip LED chip according to an embodiment of the invention.

Please refer to FIG. 9, which illustrates a cross-sectional view of a flip-chip LED chip 30' according to an embodiment of the invention. Descriptions of elements of the embodiments hereinafter that are the same as or similar to those previously described with reference to FIG. 8 may be omitted for brevity. In the embodiment, the flip-chip LED chip 30' is similar to the flip-chip LED chip 30 shown in FIG. 8. In the embodiment, the flip-chip LED chip 30' further includes conductive metal layer 405' that is electrically isolated from the conductive metal layer 405 and disposed on the first isolation layer 309 above the diffusion barrier layer 403a. Moreover, the conductive metal layer 405' further extends to fill in the opening 309a, so as to be in contact with the portion of the diffusion barrier layer 403a that is exposed from the opening 309a. In an embodiment, the conductive metal layer 405' may comprise a single layer or a multi-layer structure. In some embodiments, the conductive metal layer 405' may comprise the same material as that of the conductive layer 405.

In the embodiment, the second isolation layer 311 that is disposed on the conductive metal layers 405 and 405' and is further extended in the opening 405a to cover a portion of the sidewall of the conductive metal layers 405'. Moreover, the opening 312a of the second isolation layer 311 exposes a portion of the conductive metal layers 405'.

In the embodiment, a portion of the bonding layer 407a passes through the second isolation layer 311 via the openings 312a, so as to be in contact with the exposed portion of the conductive metal layers 405'.

In the embodiment, the reflective metal layer 401a, the diffusion barrier layer 403a, the conductive metal layers 405', and the bonding layer 407a constitute a first electrical connecting path that is electrically coupled to the second conductivity-type semiconductor layer 303 of the LED 3000. Moreover, the conductive metal layer 405 and the bonding layer 407b constitute a second electrical connecting path that is electrically coupled to the first conductivity-type semiconductor layer 301 of the LED 3000.

According to the embodiments of the invention, the grain size of the reflective metal layer, the diffusion barrier layer, the conductive layer, or the bonding layer can be reduced by adding a few second compositions therein, thereby increasing the reflectivity thereof and improving the light efficiency of the LED chip. Besides, it can be observed that electromigration in these layers occurs less, thus the overdrive performance of the LED chip can be improved. Furthermore, it is noted that the variation of the operating voltage of the LED chip with time is decreased, according to the embodiments of the invention. Namely, the reliability of the LED chip can be maintained during long-term operation, according to the embodiments of the invention.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode (LED) chip, comprising:
an LED; and
an electrode layer disposed on the LED, wherein the electrode layer comprises a reflective metal layer, a diffusion barrier layer disposed on the reflective metal layer, and an adhesive layer between the LED and the reflective metal layer, wherein the diffusion barrier layer has an interface with the reflective metal layer, and wherein each of the reflective metal layer and the diffusion barrier layer comprises:
a first composition comprising Al or Ag; and
a second composition comprising Cu, Si, Sn, Pt, Au or a combination thereof,
wherein a weight percentage of the second composition is greater than 0% and less than 20%.

2. The chip as claimed in claim 1, wherein the electrode layer further comprises a bonding layer disposed on the diffusion barrier layer.

3. The chip as claimed in claim 1, wherein the second composition further comprises Pd.

4. A light-emitting diode (LED) chip, comprising:
an LED;
a reflective metal layer disposed on the LED; and
a diffusion barrier layer disposed on the reflective metal layer, wherein the diffusion barrier layer has an interface with the reflective metal layer, and wherein each of the reflective metal layer and the diffusion barrier layer comprises:
a first composition comprising Al or Ag; and
a second composition comprising Cu, Si, Sn, Pt, Au or a combination thereof,
wherein a weight percentage of the second composition is greater than 0% and less than 20%.

5. The chip as claimed in claim 4, wherein the second composition further comprises Pd.

6. The chip as claimed in claim 5, further comprising a conductive metal layer disposed on the diffusion barrier layer.

7. The chip as claimed in claim 6, wherein the conductive metal layer comprises the first composition and the second composition, wherein a weight percentage of the second composition is greater than 0% and less than 20%.

8. A light-emitting diode (LED) chip, comprising:
an LED, wherein the LED comprises:
first and second conductivity-type semiconductor layers; and
an active layer disposed between the first conductivity-type semiconductor layer and the second conductivity-type semiconductor layer;
a reflective metal layer disposed on the LED, wherein the second conductivity-type semiconductor layer is disposed between the reflective metal layer and the active layer, and wherein the reflective metal layer comprises:
a first composition comprising Al or Ag; and
a second composition comprising Cu, Si, Sn, Pt, Au, Pd or a combination thereof,
wherein a weight percentage of the second composition is greater than 0% and less than 20%;
a diffusion barrier layer disposed on the reflective metal layer; and
a conductive metal layer disposed on the diffusion barrier layer,
wherein a portion of the conductive metal layer extends through the diffusion barrier layer, the reflective metal layer, and a portion of the LED, so as to be in contact with the first conductivity-type semiconductor layer.

9. The chip as claimed in claim 8, wherein the conductive metal layer comprises an opening, and the chip further comprises:
an isolation layer disposed on the conductive metal layer and filling the opening; and
first and second bonding layers individually disposed on the isolation layer,
wherein a portion of the first bonding layer is in the opening and passes through the isolation layer to be in contact with the diffusion barrier layer, and a portion of the second bonding layer extends through the isolation layer to be in contact with the conductive metal layer.

10. The chip as claimed in claim 9, wherein at least one of the first and second bonding layers comprises the first composition and the second composition, and wherein a weight percentage of the second composition is greater than 0% and less than 20%.

11. The chip as claimed in claim 9, wherein the conductive metal layer comprises an opening, and the chip further comprises:
a second conductive metal layer in the opening to be in contact with the diffusion barrier layer;
an isolation layer disposed on the conductive layer and filling the opening to cover a portion of the second conductive metal layer; and first and second bonding layers individually disposed on the isolation layer, wherein a portion of the first bonding layer passes through the isolation layer to be in contact with the second conductive metal layer, and a portion of the second bonding layer extends through the isolation layer to be in contact with the conductive metal layer.

12. The chip as claimed in claim 11, wherein at least one of the first and second bonding layers comprises the first composition and the second composition, and wherein a weight percentage of the second composition is greater than 0% and less than 20%.

* * * * *